US010924320B2

(12) United States Patent
Ramakrishnan et al.

(10) Patent No.: US 10,924,320 B2
(45) Date of Patent: Feb. 16, 2021

(54) IQ MISMATCH CORRECTION MODULE

(71) Applicant: TEXAS INSTRUMENTS INCORPORATED, Dallas, TX (US)

(72) Inventors: Sthanunathan Ramakrishnan, Bengaluru (IN); Chandrasekhar Sriram, Chennai (IN); Raju Kharataram Chaudhari, Pune (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/525,103

(22) Filed: Jul. 29, 2019

(65) Prior Publication Data

US 2020/0153675 A1 May 14, 2020

Related U.S. Application Data

(60) Provisional application No. 62/786,702, filed on Dec. 31, 2018.

(30) Foreign Application Priority Data

Nov. 14, 2018 (IN) ............................ 201841042767

(51) Int. Cl.

| | |
|---|---|
| ***H04L 27/36*** | (2006.01) |
| ***H03D 3/00*** | (2006.01) |
| ***H04B 1/30*** | (2006.01) |
| ***H04L 27/38*** | (2006.01) |

(52) U.S. Cl.

CPC .......... *H04L 27/364* (2013.01); *H03D 3/009* (2013.01); *H04B 1/30* (2013.01); *H04L 27/3863* (2013.01)

(58) Field of Classification Search

CPC ... H04L 27/364; H04L 27/3863; H03G 3/009; H04B 1/30

See application file for complete search history.

(56) References Cited

U.S. PATENT DOCUMENTS

| | | | | |
|---|---|---|---|---|
| 7,715,836 | B2 * | 5/2010 | Vassiliou | H04B 17/14 455/423 |
| 9,702,898 | B1 * | 7/2017 | Lipka | B81B 3/0021 |
| 9,813,267 | B1 * | 11/2017 | Barghi | H04L 27/2626 |
| 2011/0222631 | A1 * | 9/2011 | Jong | H04L 27/3863 375/316 |
| 2014/0362955 | A1 * | 12/2014 | Muhammad | H04B 1/16 375/343 |
| 2018/0083823 | A1 * | 3/2018 | Saigusa | H04L 7/0008 |
| 2020/0076671 | A1 * | 3/2020 | Marschner | H03D 3/009 |

* cited by examiner

*Primary Examiner* — Sophia Vlahos

(74) *Attorney, Agent, or Firm* — John R. Pessetto; Charles A. Brill; Frank D. Cimino

(57) ABSTRACT

An IQ estimation module comprising a powerup state IQ estimator configured to generate powerup state IQ estimates based on a powerup calibration of the IQ estimation module, a steady state IQ estimator configured to generate steady state IQ estimates during a steady state operation of the IQ estimation module, and an IQ estimate extender configured to determine differences between the powerup state IQ estimates and steady state IQ estimates at their respective frequency bins and adjust the powerup state IQ estimates to improve the accuracy of IQ estimates.

18 Claims, 9 Drawing Sheets

S110 — COMPUTE ACTUAL DIFFERENCE BETWEEN POWERUP STATE IQ ESTIMATES AND STEADY STATE IQ ESTIMATES

S112 — GENERATE REAL COMPONENTS OF VIRTUAL DIFFERENCES BY DETERMINING SYMMETRIC REFLECTIONS OF REAL COMPONENTS OF ACTUAL DIFFERENCES OVER ZERO FREQUENCY HERTZ

S114 — GENERATE IMAGINARY COMPONENTS OF VIRTUAL DIFFERENCES BY DETERMINING VALUES ON A LINEAR LINE CONNECTING IMAGINARY COMPONENTS OF ACTUAL DIFFERENCES

S116 — GENERATE VIRTUAL DIFFERENCES BASED ON THE GENERATED ACTUAL AND VIRTUAL COMPONENTS

S118 — INTERPOLATE THE ACTUAL AND VIRTUAL DIFFERENCES ACROSS THE FREQUENCY RANGE OF INTEREST

S120 — ADJUST THE POWERUP STATE IQ ESTIMATES

RESIDUAL IQ MISMATCH AT 85 C (dBc)

| | CURRENT TONES | | NEW TONE |
|---|---|---|---|
| | 50 MHz | 100 MHz | -50 MHz |
| PRIOR ART | **-74.8** | -80.3 | **-60.9** |
| PRESENT INVENTION | *-85* | -80.2 | *-68.3* |

IQ MISMATCH CORRECTION MODULE

RELATED APPLICATIONS

This application claims priority to Indian Provisional Application No. 201841042767, filed Nov. 14, 2018, and U.S. Provisional Application No. 62/786,702, filed Dec. 31, 2018, which are hereby incorporated by reference.

BACKGROUND

In a quadrature signal system, baseband signal may comprise two-real signals: in-phase (I) and quadrature-phase (Q) signals. These I and Q baseband signals are multiplied with cosine and sine waves of a RF transmitter and combined to generate a RF passband signal (IQ RF signals). Ideally, the cosine and sine waves of the RF transmitter have the same amplitude and differ in phase by 90 degrees, thereby making the IQ RF signals a pair of quadrature signals. Zero-IF receiver employs homodyne or direct down conversion method to receive this pair of quadrature signals. During the direct down conversion, the passband signal is mixed with the in-phase and quadrature-phase components of a local oscillator signal to generate IQ baseband signals for further baseband processing.

While receiving the IQ RF signals, it is important to maintain the amplitude and phase relationship between the I and Q signals to ensure an accurate signal reception. It is also important to maintain the same gain and the 90 degree phase relationship between the in-phase and quadrature-phase components of the local oscillator to prevent a gain or phase skew between the I and Q signals. In reality, however, errors such as an IQ gain/phase imbalance existing in a zero-IF receiver impairs the amplitude and phase relationship between the IQ RF signals. Such IQ gain/phase imbalances are due to mismatches in the gain and phase between the components of the local oscillator, and the mismatches in the analog filters and analog-digital converters (ADC) between the I and Q paths.

A correction is attempted to compensate for impairments caused by IQ mismatch by, estimating the IQ mismatch. The zero-IF receiver may, in turn, compensate for skews on the pair of quadrature signals by correcting the quadrature signals based on the IQ mismatch estimates.

SUMMARY

An aspect of the present invention provides an IQ estimation module configured to adjust powerup state IQ estimates based on interpolated differences between powerup state IQ estimates and steady state IQ estimates, an IQ signal receiver comprising an IQ estimation module configured to adjust powerup state IQ estimates based on interpolated differences between powerup state IQ estimates and steady state IQ estimates, and a method of adjusting powerup state IQ estimates based on interpolated differences between powerup state IQ estimates and steady state IQ estimates.

BRIEF DESCRIPTION OF THE DRAWINGS

For a detailed description of various examples, reference will now be made to the accompanying drawings in which.

DETAILED DESCRIPTION

In the following detailed description, reference is made to certain examples of the present invention. These examples are described with sufficient detail to enable those skilled in the art to practice them. It is to be understood that other examples may be employed and that various structural, logical, and electrical changes may be made. Moreover, while specific examples are described in connection with a zero-IF transmitter or receiver, it should be understood that features described herein are generally applicable to other types of electronic parts, circuits, or transmitters.

In this description, the term "couple" or "couples" means either an indirect or direct wired or wireless connection. Thus, if a first device couples to a second device, that connection may be through a direct connection or through an indirect connection via other devices and connections. For another instance, when a first device is coupled to a second device, the first and second device may be coupled through a capacitor. The recitation "based on" means "based at least in part on." Therefore, if X is based on Y, X may be a function of Y and any number of other factors.

Figure 1:
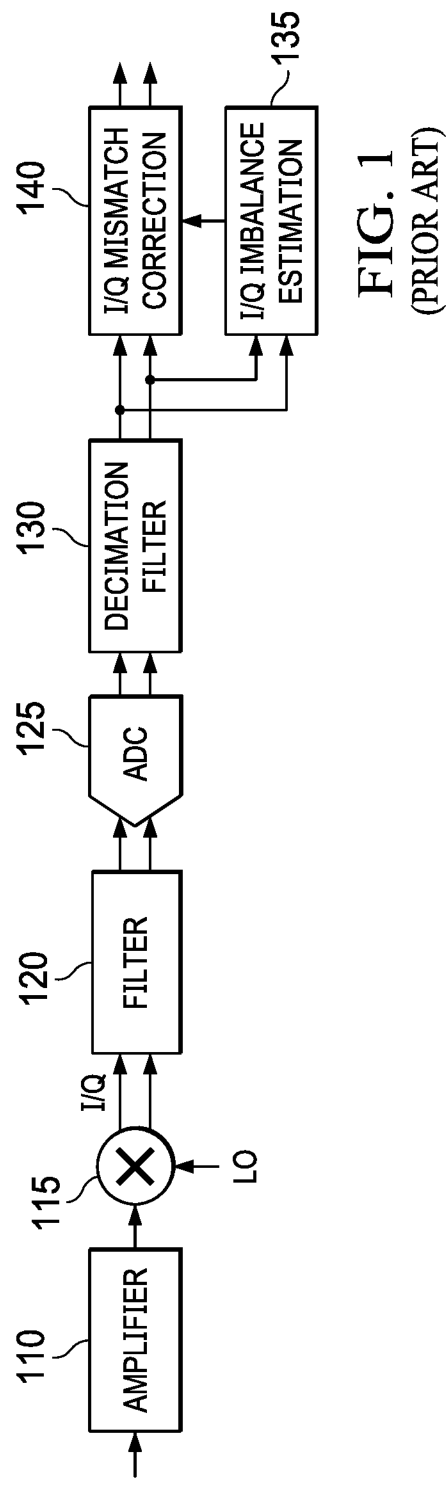
FIG. 1 illustrates a block diagram of a prior art zero-IF receiver.

FIG. 1 illustrates a block diagram of a zero-IF receiver according to an example of prior art. The prior art zero-IF receiver of FIG. 1 comprises amplifier 110 amplifying the received quadrature passband signals, mixer 115 down-converting the amplified quadrature passband signals with in-phase and quadrature-phase components of a local oscillator signal, and filter 120 filtering signals within the frequency range of interest.

The zero-IF receiver of FIG. 1 further comprises analog digital convertor 125 to convert the filtered signal from filter 120 into digital signals, an optional decimation filter 130 reducing the rate of the digital signals, IQ imbalance estimation module 135 estimating the IQ imbalance based on the down-converted digital signals, and IQ mismatch correction module 140 correcting the digital signals output from decimation filter 130 to compensate for IQ imbalance estimated in the digital signals.

Figure 2:
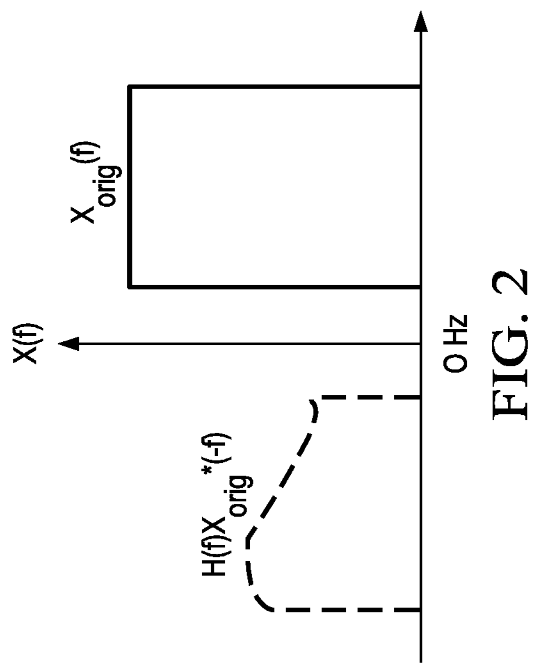
FIG. 2 illustrates a signal spectrum of baseband signal and image signal of the baseband signal due to IQ mismatch.

FIG. 2 illustrates a frequency spectrum of baseband signal and image signal of the baseband signal due to IQ mismatch. In the example of FIG. 2, signals on the right pane of frequency spectrum, positive frequency signals, reflect the original signal $X_{orig}(f)$ transmitted from a zero-IF transmitter. In an ideal zero-IF transmitter and zero-IF receiver without an IQ mismatch, only the original signal $X_{orig}(f)$ should be observed when the zero-IF receiver processes the quadrature passband signals to baseband signals. Because of IQ mismatch, however, the output signal includes an image signal, in the example of FIG. 2, $H(f)X_{orig}^*(-f)$ of negative frequency.

In FIG. 2, H(f) is an IQ mismatch function, which may be estimated based on an IQ mismatch estimation algorithm. The IQ mismatch function H(f) may be used by a zero-IF receiver to compensate a signal skew due to IQ mismatch.

Figure 3A:
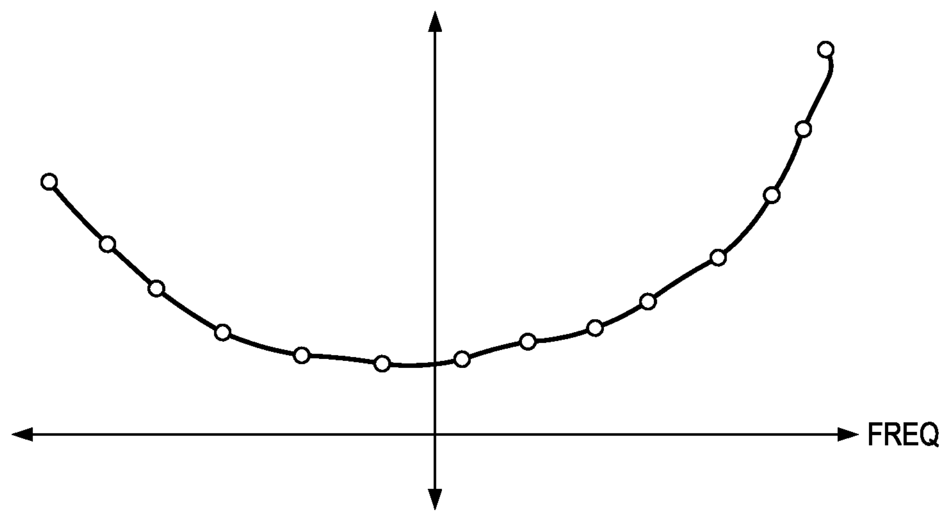
FIGS. 3A-3B illustrate graphs of IQ mismatch estimates during powerup calibration and steady state.

FIG. 3 illustrates graphs of IQ mismatch estimates during powerup calibration and steady state. In particular, graph of FIG. 3A reflects IQ estimates across a frequency band of interest based on a powerup calibration of a zero-IF receiver. These powerup phase IQ estimates are measured before the zero-IF receiver is operational in steady state mode. During this powerup phase, the system is not expected to receive actual input signals and hence calibration signals may be used to estimate IQ mismatch. Zero-IF receiver relies on the powerup phase IQ mismatch estimates as an initial estimate to correct incoming IQ passband signal for IQ mismatch.

During the powerup phase of the zero-IF receiver, however, its temperature is below a range of temperature of zero-IF receiver in its steady state. This is because during the powerup phase, less components, such as a power amplifier employed to amplify a transmitting signal, are in use. During a steady state, zero-IF receiver subsequently estimates steady state IQ mismatch corresponding to a number of frequency bins based on received IQ passband signals and adjusts the powerup state IQ estimates based on the steady state IQ estimates.

Figure 3B:
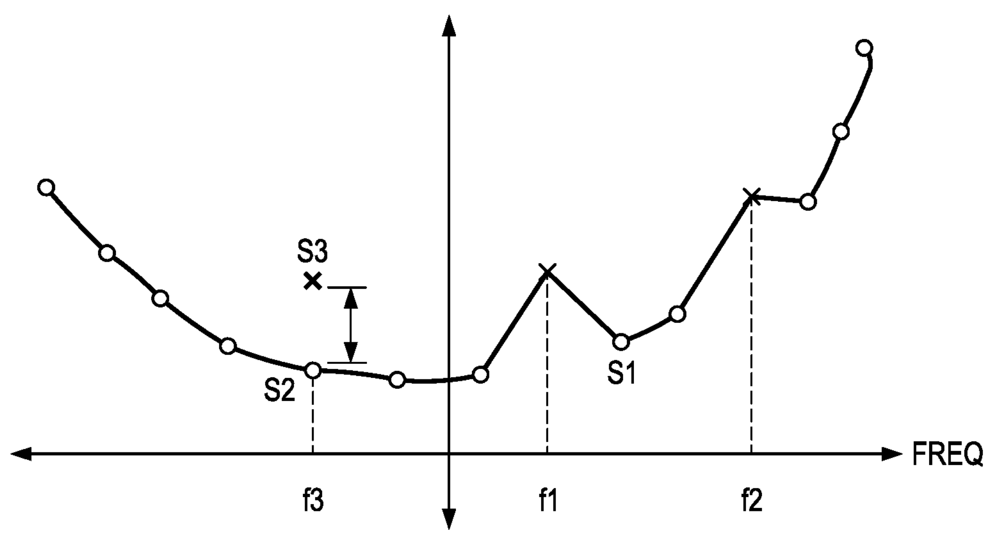

Graph of FIG. 3B illustrates the adjusted powerup state IQ estimates S1 where estimates at frequency bins f1 and f2 are adjusted to reflect the new, subsequent steady state IQ estimates at frequency bins f1 and f2. The adjusted powerup state IQ estimates S1, as illustrated, fails to correctly estimate IQ mismatch of other frequency bins at steady state. For instance, where IQ passband signals from baseband frequency f3 is received by the zero-IF receiver, the adjusted powerup state IQ estimates S1 still provides S2 as IQ mismatch estimate corresponding to frequency bin f3 even if the accurate IQ mismatch estimate for frequency bin f3 during a steady state operation is S3.

Figure 4:
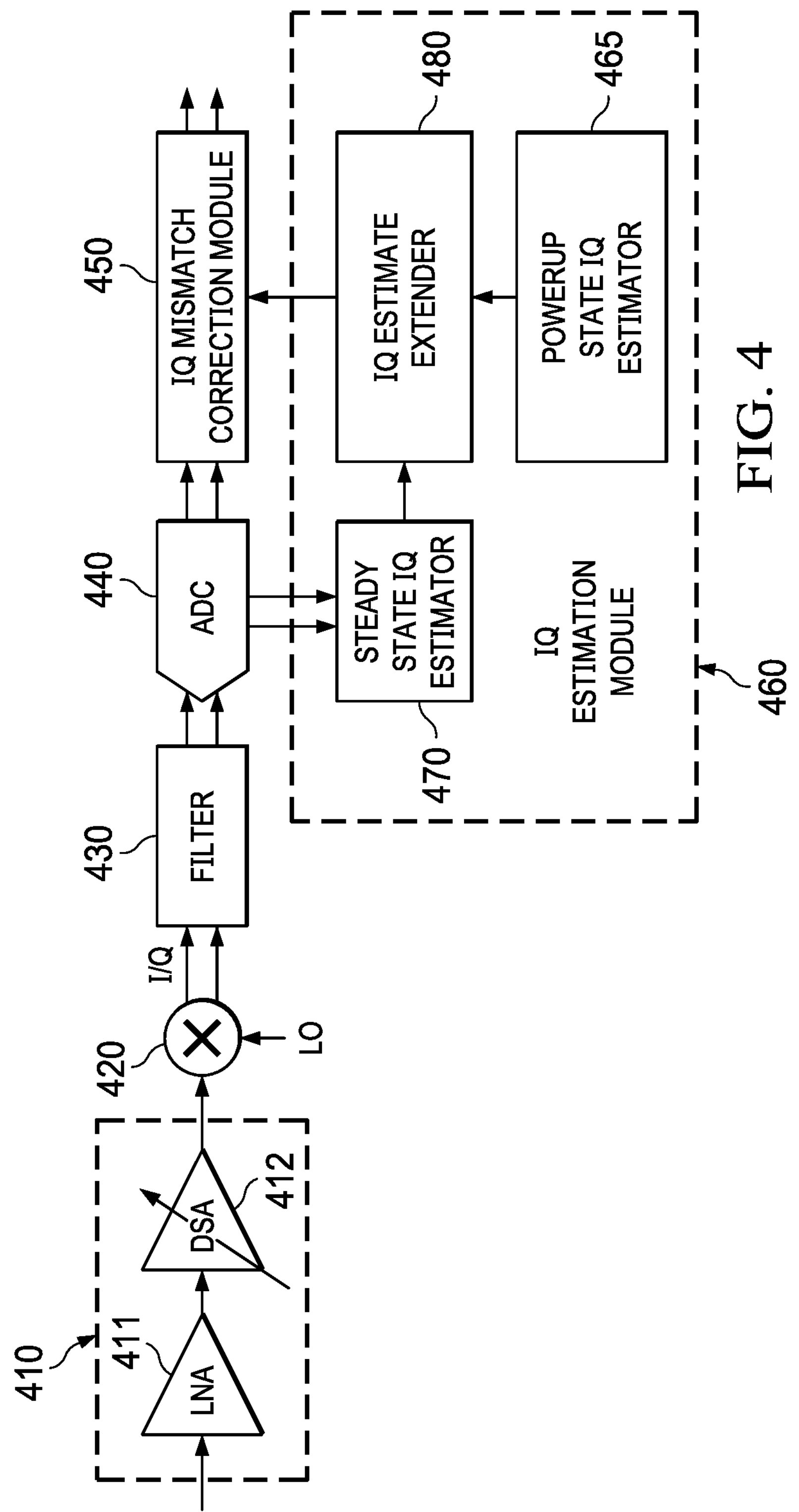
FIG. 4 illustrates a block diagram of a zero-IF receiver according to an aspect of the present invention.

FIG. 4 illustrates a block diagram of a zero-IF receiver according to an aspect of the present invention. The zero-IF receiver of FIG. 4 comprises amplifier 410 configured to amplify the passband quadrature signals received by the zero-IF receiver, mixer 420 configured to mix the in-phase and quadrature components of local oscillator signal with the amplified passband signals to generate baseband quadrature signals, and filter 430 configured to filter the baseband quadrature signals. In the example of FIG. 4, amplifier 410 includes low noise amplifier 411 configured to amplify the received signal and digital step amplifier 412 configured to be gain adjustable. Filter 430 of FIG. 4 may be a lowpass filter configured to pass signals under certain frequency while filtering noise from the mixed quadrature signals.

Quadrature signals output from filter 430 is converted into digital signals by analog digital convertor 440. The digital quadrature signals may further be down-converted into an acceptable sampling rate preferable for a system receiving the passband quadrature signals by a decimation filter.

IQ estimation module 460 provides an estimate of IQ mismatch corresponding to a frequency bin of received signal, and IQ mismatch correction module 450 compensates the received signal for IQ mismatch based on the IQ estimates provided by IQ estimation module 460.

Figure 5:
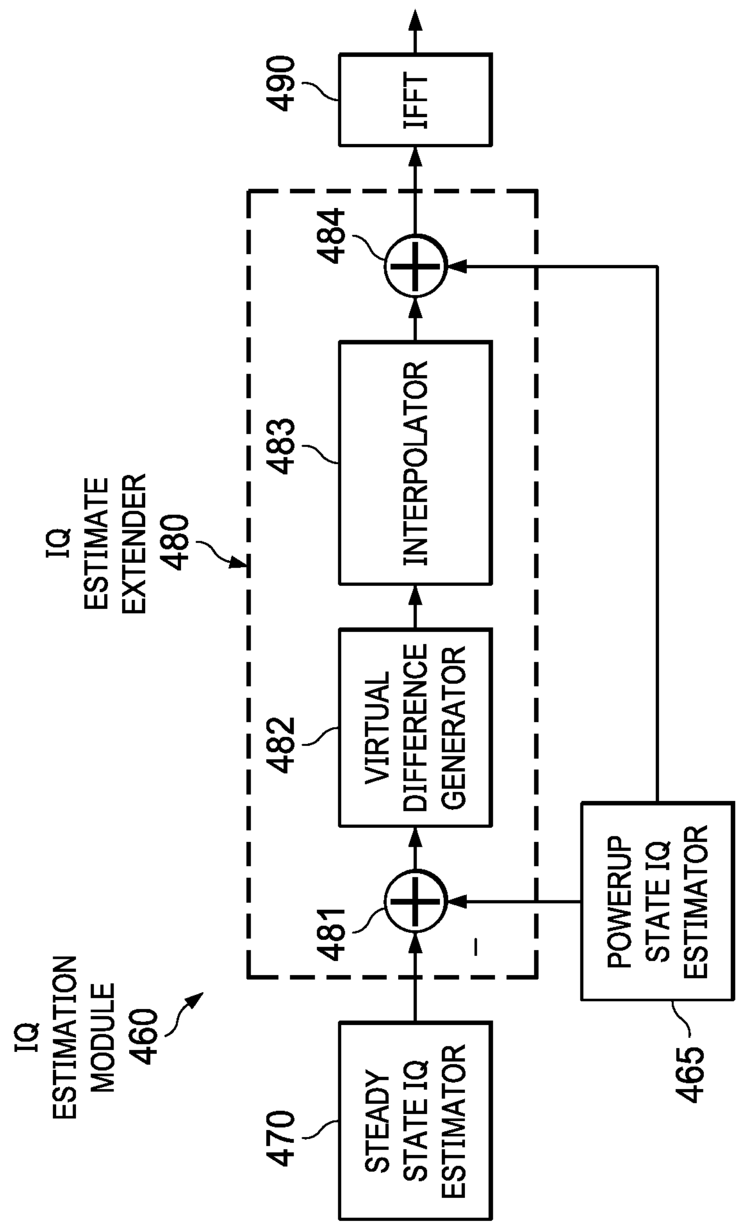
FIG. 5 illustrates a block diagram of an IQ estimation module according to an aspect of the present invention.

FIG. 5 illustrates a block diagram of IQ estimation module 460 of FIG. 4 according to an aspect of the present invention, which includes powerup state IQ estimator 465, steady state IQ estimator 470, and IQ estimate extender 480. Powerup state IQ estimator 465 estimates powerup state IQ mismatches for a frequency range during or based on a powerup calibration of IQ estimation module 460 (or a zero-IF receiver employing IQ estimation module 460).

For instance, during the powerup calibration, IQ estimation module 460, or the zero-IF receive employing IQ estimation module 460, is fine tuned to adjust IQ mismatch and skews caused by its internal components. IQ mismatch may be estimated during powerup calibration by using calibration signals based on multiple bins, thereby obtaining IQ mismatch estimates across the entire frequency band of interest. The IQ mismatches estimated by powerup state IQ estimator 465 is stored in powerup state IQ estimator 465 as powerup state IQ estimates.

Steady state IQ estimator 470 estimates IQ mismatches during a steady state. During a steady state, IQ estimation module 460 (or zero-IF receiver employing IQ estimation module 460) receives IQ signals. This often entails the powering up and use of a power amplifier, which in turn increases temperature of IQ estimation module 460. Such temperature increase affects the IQ mismatch characteristics of a IQ signal channel, leading to an IQ mismatch estimate different from an IQ mismatch estimated during or based on a powerup calibration. Steady state IQ estimator 470 estimates IQ mismatches during such steady state as steady state IQ estimates. Because steady state IQ estimates are based on incoming IQ passband signals during an regular operation of IQ estimation module 460, steady state IQ estimator 470 estimates IQ mismatches for a number of frequency bins of a frequency band of interest, but rarely all, at a given point in time.

IQ estimate extender 480 computes actual differences between powerup state IQ estimates and steady state IQ estimates, generates virtual differences based on the actual differences, interpolates the actual and virtual differences across the frequency range of interest and adjusts the powerup state IQ estimates. The adjusted powerup state IQ estimates is provided to IQ mismatch correction module 450 to compensate the IQ baseband digital signals output from analog digital converter 440. In the example of FIG. 5, the adjusted powerup state IQ estimates are inverse fast fourier transformed into their time domain equivalents via inverse fast fourier transform logic 490.

In FIG. 5 example, powerup state IQ estimates output from powerup state IQ estimator 465 is adjusted by IQ estimate extender 480 based on steady state IQ estimates output from steady state IQ estimator 470. As noted above, while powerup state IQ estimates are estimates of IQ mismatches measured by powerup state IQ estimator 465 across a frequency range of interest, steady state IQ estimates are estimates of IQ mismatches measured by steady state IQ estimator 470 based on a selective number of frequency bins of the frequency range determined by the frequency content of the input signals to the device. For instance, steady state IQ estimates may be estimates of steady state IQ estimates for two tone signals at frequency bins, f11 and f12. To adjust powerup state IQ estimates, IQ estimate extender 480 first computes an actual difference between steady state IQ estimates and powerup states IQ estimates at two frequency bins, f11 and f12.

In particular, actual difference generator 481 of IQ estimate extender 480 computes the actual difference between steady state IQ estimates and powerup state IQ estimates by subtracting the values of steady state IQ estimate corresponding to frequency bins f11 and f12 from the values of powerup state IQ estimate corresponding to frequency bins f11 and f12, respectively.

According to an example of the present invention, a model for IQ mismatch is expressed in the below equation 1.

$$H_T(\omega)=\Sigma_{i=0}^{N-1}a_{i,T}*f_i(\omega)+U(\omega) \quad \text{Eq. 1)}$$

In the above equation, $a_{i,T}$ is the ith mismatch parameters at temperature T, $f_i(\omega)$ is ith known function of frequency that accounts for a modeled mismatch, and U(w) is an unmodeled mismatch. The unmodeled mismatch component has a lower impact on the overall IQ mismatch at about −60 dBc.

Actual differences between the powerup state IQ estimates and steady state IQ estimates, corresponding to input tone frequency bins, are obtained according to below equation 2, where powerup state temperature is T0 and steady state temperature is T1.

$$H_{T1}(\omega)-H_{T0}(\omega)\cong\Sigma_{i=0}^{N-1}(a_{i,T1}-a_{i,T0})*f_i(\omega). \text{Eq. 2)}$$

The unmodeled mismatch component is neglected as the impact of the change in unmodeled mismatch is lower than the required levels of correction.

In an exemplary zero-IF receiver, an IQ mismatch model is dominated by mixer (e.g., mixer 420) IQ mismatch, first order baseband filter's (e.g., filter 430) IQ mismatch, and delay mismatch between the I and Q analog digital converter (e.g., analog digital converter 440). In such example, equation 1 above may be expressed as equation 3 below.

$$H_T(\omega)=(a_{0,T}\cdot\omega^2+a_{1,T})+j(a_{2,T}\cdot\omega+a_{3,T}) \quad \text{Eq. 3)}$$

In the above equation 3, $a_0$ and $a_2$ are dependent on filter and analog digital converter delay mismatch, and $a_1$ and $a_3$ are dependent on mixer IQ mismatch. According to equation 3, the real components of IQ mismatch are a second order function of ω, which may be expressed as a parabolic function of ω. Imaginary components of IQ mismatch are a first order function of ω, which may be expressed as a linear function of ω.

Based on the real and imaginary characteristics of equation 3, virtual difference generator 482 of IQ estimate extender 480 generates a virtual difference, corresponding to the negative frequency bins of f11 and f12, based on the actual differences computed by actual difference generator 481. Interpolator 483 interpolates the actual difference across the entire frequency range of interest based on the actual difference and virtual differences. Adjusted IQ estimate generator 484 of IQ estimate extender 480 adjusts the powerup state IQ estimates output from powerup state IQ estimator 465 based on the interpolated differences and the powerup state IQ estimates.

Figure 6A:
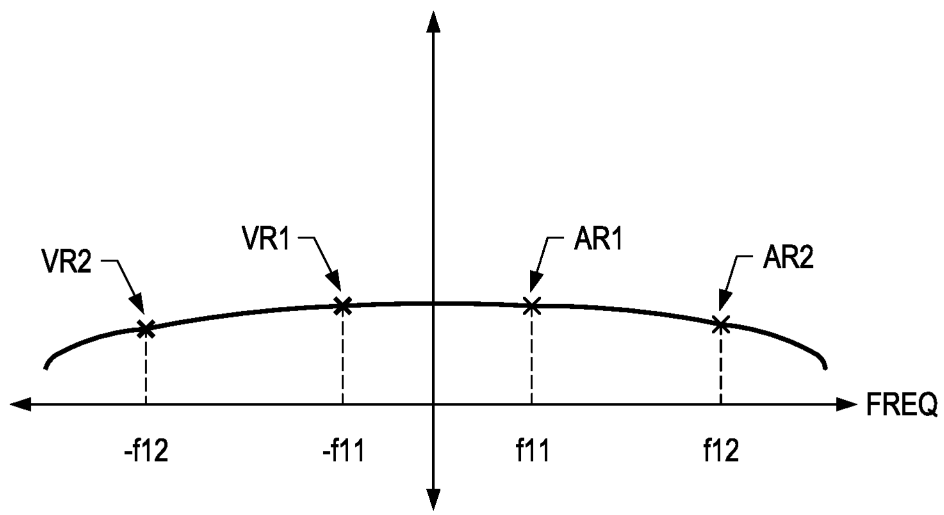
FIGS. 6A-6C illustrate graphs of virtual differences generated according to an aspect of the present invention.
Figure 6B:
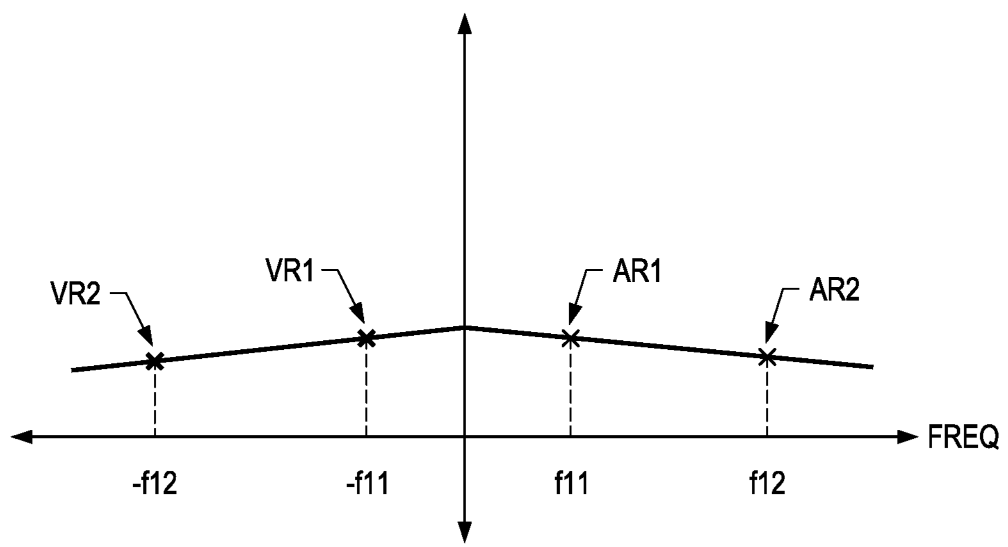
Figure 6C:
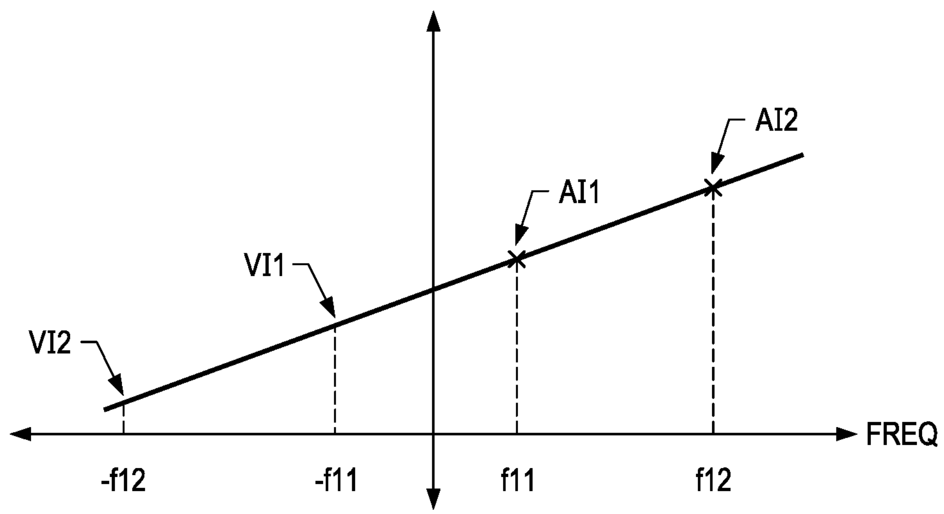

FIGS. 6A-6C illustrate graphs of virtual differences generated according to an aspect of the present invention. Graphs of FIGS. 6A-6B illustrate real components AR1, AR2 of actual differences computed by actual difference generator 481, each corresponding to a difference between a powerup state IQ estimate and a steady state IQ estimate at frequency bins f11 and f12, respectively. Based on the characteristics of equation 3, virtual difference generator 482 computes virtual differences with real components VR1 and VR2, each corresponding to frequency bins −f11 and −f12, respectively.

As seen in graphs of FIGS. 6A and 6B, real components of virtual difference generated by virtual difference generator 482 is a symmetric reflection of real components of actual difference over zero frequency hertz. Based on the real components of the virtual differences and actual differences, which are AR1, AR2, VR1, and VR2, interpolator 483 interpolates the real components differences across the frequency range of interest. In graph of FIG. 6A, interpolator 483 employs a parabolic curve to connect and interpolate the real components of virtual and actual differences. In graph of FIG. 6B, interpolator 483 employs a linear curve to connect and interpolate the real components of virtual and actual differences. The real components of the interpolated differences are symmetric over zero frequency hertz.

In the present aspect of the invention, the actual differences are not adjusted and virtual differences are obtained based on the model at frequencies for which we do not have actual estimates. This method gives weightage to actual estimates, does not change the actual estimates, and uses the model only to predict at frequencies for which there are no estimates.

Graph of FIG. 6C illustrates imaginary components AI1, AI2 of actual difference computed by actual difference generator 481, each corresponding to a difference in a powerup state IQ estimate and a steady state IQ estimate at frequency bins f11 and f12, respectively. Based on the characteristics of equation 3, virtual generator 482 computes virtual difference with imaginary components VI1 and VI2, each corresponding to frequency bins −f11 and −f12, respectively. Interpolator 483 employs a linear line to connect and interpolate the imaginary components of virtual and actual differences.

In the FIGS. 6A-6C example, two virtual differences are generated based on two actual differences. According to another example of the present invention, where there are more than two actual differences, a corresponding number of virtual differences may be generated based on a method described in FIGS. 6A-6C. According to yet another example of the present invention, where there are more than two actual differences, a number of virtual differences (e.g.,) may be generated based on two actual differences closest to zero frequency hertz among the more than two actual differences.

Figure 7:
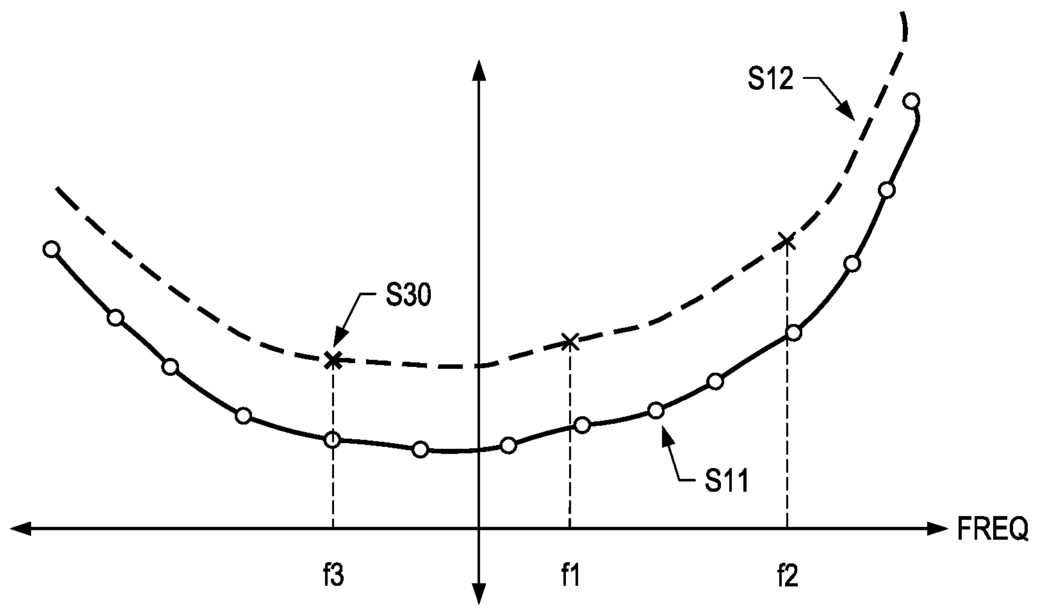
FIG. 7 illustrates a graph of adjusted powerup state IQ estimates according to an aspect of the present invention.

FIG. 7 illustrates a graph of adjusted powerup state IQ estimates according to an aspect of the present invention. An original powerup state IQ estimates S11 is adjusted by adjusted IQ estimate generator 484 as adjusted powerup state IQ estimates S12. The adjusted powerup state IQ estimates are adjusted based on the actual differences between the original powerup IQ state estimates and steady state IQ estimates at frequency bins f1 and f2. Accordingly, the adjusted powerup state IQ estimates correctly mirrors the steady state IQ estimates at frequency bins f1 and f2.

Adjusted powerup state IQ estimates are also adjusted based on interpolated differences at frequency bins besides frequency bins f1 and f2. The adjustment based on interpolated differences deliver IQ estimates closer to the steady state IQ estimates. For instance, the adjusted powerup state IQ estimate at frequency bin f3 is almost the same as steady state IQ estimate value S30, which is a steady state IQ mismatch estimated at frequency bin f3.

Figure 8A:
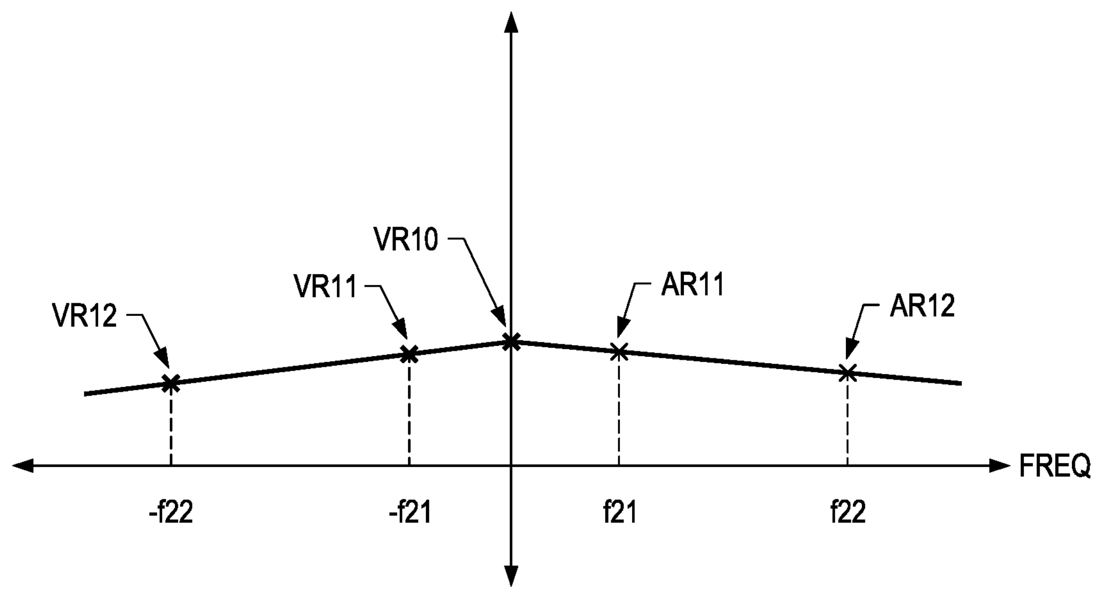
FIGS. 8A-8B illustrate graphs of virtual differences generated according to yet another aspect of the present invention.
Figure 8B:
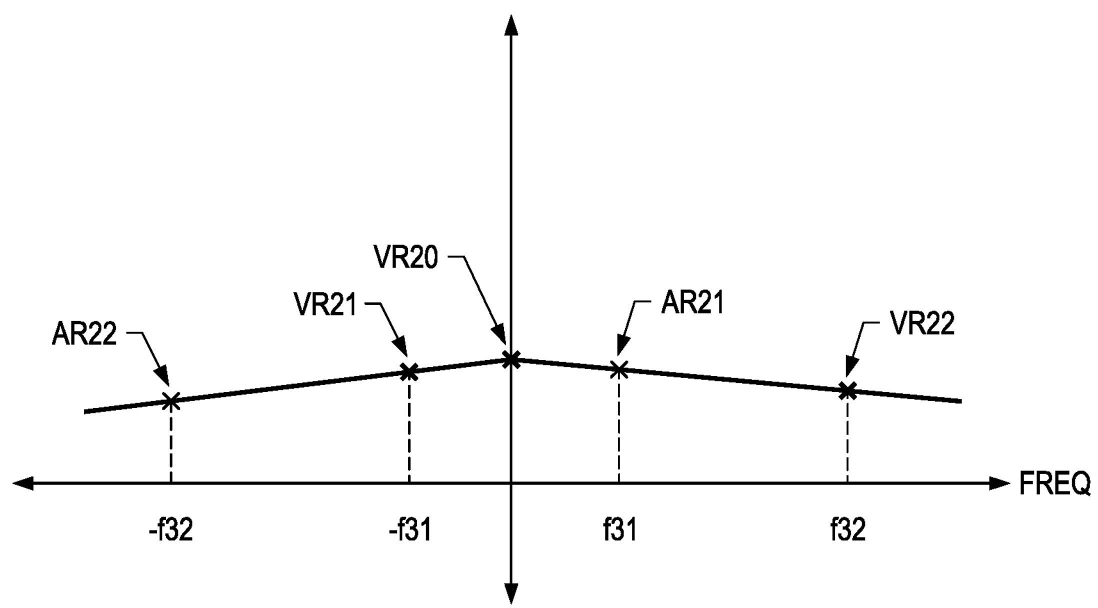

FIGS. 8A-8B illustrate graphs of virtual differences generated according to an aspect of the present invention. In graph of FIG. 8A, real components AR11 and AR12 are real components of actual differences computed by actual difference generator 481, each respectively corresponding to frequency bins f21 and f22. Virtual difference generator 482 generate real components VR11 and VR12, each respectively corresponding to frequency bins −f21 and f22 based on a symmetric reflection of real components AR11 and AR12. Virtual difference generator 482 further generates a virtual difference with real component VR10 based on a linear line connecting the real components of actual difference or virtual differences.

Similarly, in graph of FIG. 8B, real components VR21 and VR22 of virtual differences are generated by determining a symmetric reflection of each real components AR21 and AR22 of actual differences respectively corresponding to frequency bins f31 and −f32. As with graph of FIG. 8A, virtual difference generator 482 may generate real component VR20 corresponding to a virtual difference at zero frequency hertz.

Figure 9:
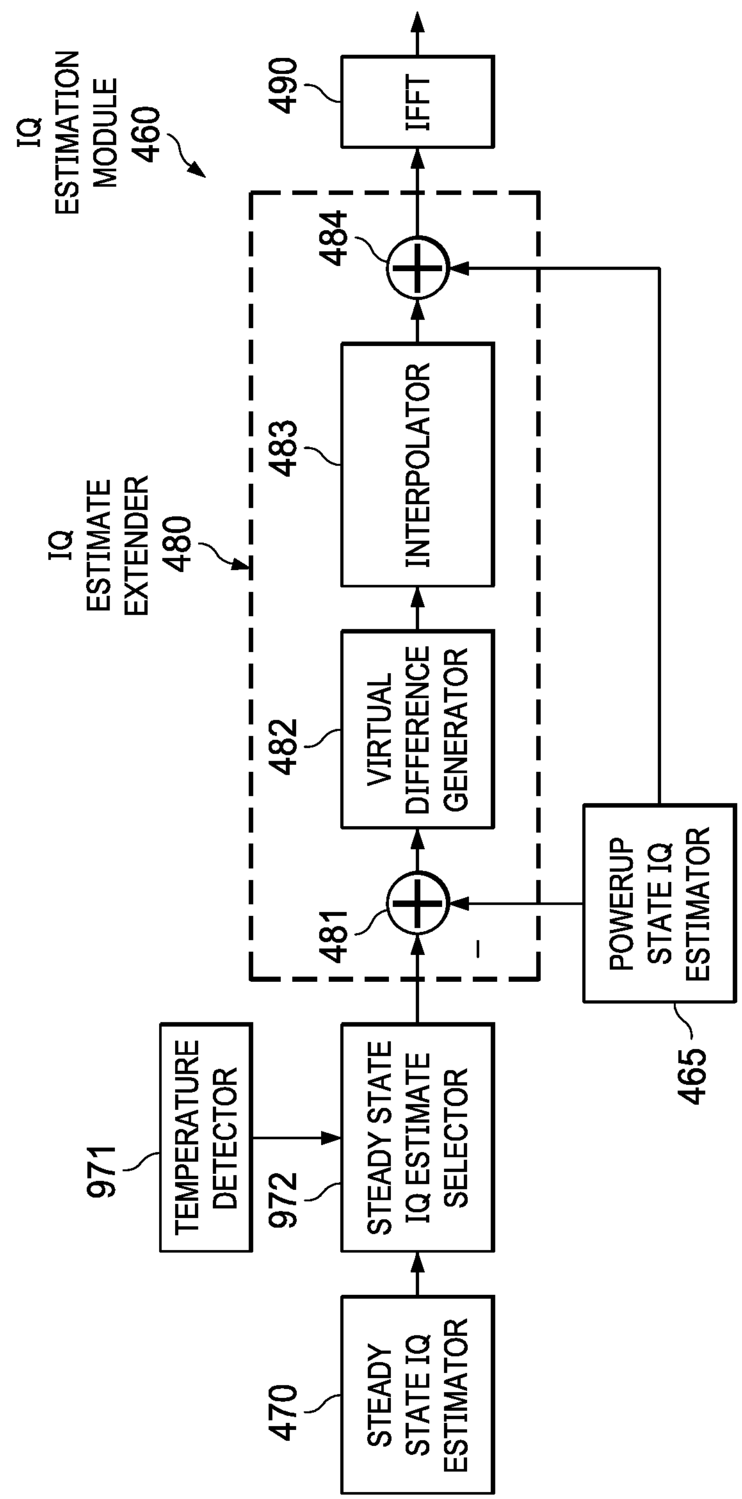
FIG. 9 illustrates a block diagram of an IQ estimation module according to an aspect of the present invention.

FIG. 9 illustrates a block diagram of an IQ estimation module according to yet another aspect of the present invention. As noted previously, IQ estimates are affected by temperature. Accordingly, steady state IQ estimates for temperate T1 may be different from steady state IQ estimates for temperature T2. To account for the difference in temperature, IQ estimation module 460 of FIG. 9 may further comprise temperature detector 971 for detecting the temperature of IQ estimation module 460. Further, steady state IQ estimator 470 is comprised to store and output steady state IQ mismatch estimates along with the temperatures at which they were estimated. The temperature of the estimates may be binned into various ranges. In the current example, steady state IQ mismatch estimates are available for at least two temperature ranges, for instance, first temperature range from 60° C. to 75° C. and second temperature range from 75° C. to 90° C. Based on the temperature detected by temperature detector 971, steady state IQ estimate selector 972 selects the set of steady state IQ estimates which are closest in temperature to the current temperature and outputs the IQ mismatch estimates to IQ estimate extender 480. IQ estimate extender 480 generates adjusted powerup state IQ estimates based on the set of steady state IQ estimates output from steady state IQ estimate selector 972. This results in a set of estimates that are most suited for the current temperature and avoids using estimates from the wrong temperature range for current IQ mismatch correction.

Figures 10, 11:
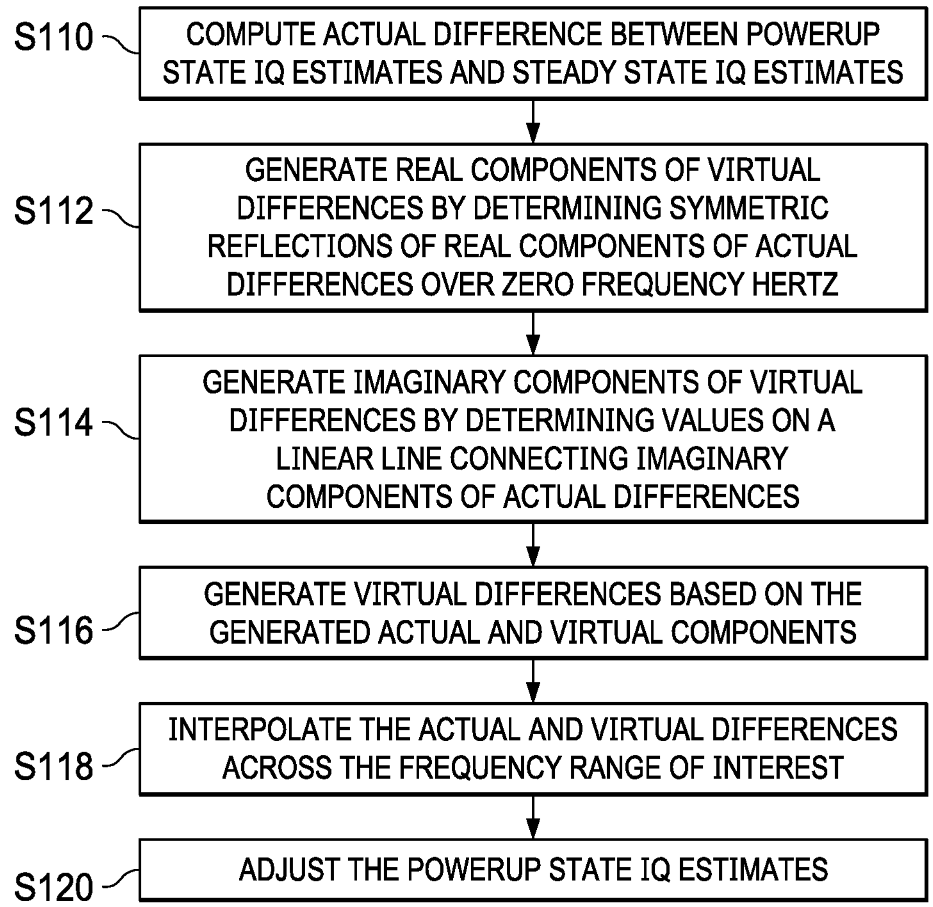
FIG. 10 illustrates a flow chart of a method of generating an adjusted powerup state IQ estimates according to an aspect of the present invention.
FIG. 11 illustrates a table comparing an IQ mismatch level during an operation of a zero-IF receiver in its steady state with and without an IQ estimation module according to an aspect of the present invention.

FIG. 10 illustrates a flow chart of a method of generating an adjusted powerup state IQ estimate according to an aspect of the present invention. According to the method, actual differences between powerup state IQ estimates and steady state IQ estimates, each corresponding to a difference between a powerup state IQ estimate and a steady state IQ estimate at a bin of input tone signal bins, are calculated. (S110). Thereafter, real components of virtual differences are generated by determining the symmetric reflections of real components of actual differences over zero frequency hertz. (S112). Imaginary components of virtual differences are generated by determining values on a linear line connecting imaginary components of actual differences. (S114). In particular, imaginary components of virtual differences are values of the linear line corresponding to image frequency bins of input tone signal bins.

Virtual differences are generated based on the real components and imaginary components generated based on the actual differences. (S116). The actual and virtual differences are interpolated across the frequency range of interest. (S118). The powerup state IQ estimates are adjusted based on the interpolated differences. (S120).

FIG. 11 illustrates a table comparing an IQ mismatch level during an operation of a zero-IF receiver in its steady state with and without an IQ estimation module according to an aspect of the present invention. To compare the IQ mismatch levels, powerup calibration is performed at 25° C., followed by steady state calibration with two tone signals of 50 and 100 MHz at 85° C. Thereafter, an IQ estimation module is frozen and an input signal of −50 MHz is provided. Performance is obtained from a prior art IQ estimation module and an IQ estimation module according to an aspect of the present invention. As observed in the table of FIG. 11, the performance of an IQ estimation module according to an aspect of the present invention is improved by about 7 dB at the new tone.

The above description and drawings are only to be considered illustrative of an example of the present invention which achieves the features and advantages described herein. Modifications are possible in the described examples, and other examples are possible, within the scope of the claims. Accordingly, the examples of the present invention described herein is not considered as being limited by the foregoing description and drawings.

For instance, steady state estimate may be made for only one frequency bin. The value of the steady state estimate corresponding to the one frequency bin may then be expanded across the entire band, which will be a constant across an entire frequency band of interest. The extended difference can be added to the power up estimates to get an improved estimate. This causes the power up estimates to shift by the difference value, retaining its shape, which usually results in a better estimate at other frequencies. Such modification is within the scope of the present invention.

What is claimed is:

1. An in-phase and quadrature-phase (IQ) estimation module comprising:
- a powerup state IQ estimator configured to generate powerup state IQ estimates across a frequency band based on a powerup calibration of the IQ estimation module;
- a steady state IQ estimator configured to generate steady state IQ estimates for at least one frequency bin of the frequency band during a steady state operation of the IQ estimation module; and
- an IQ estimate extender coupled to the powerup state IQ estimator and the steady state IQ estimator, and configured to compute an actual difference between the powerup state IQ estimates and the steady state IQ estimates, interpolate the actual difference across the frequency band, and adjust the powerup state IQ estimates across the frequency band based on the interpolated difference,
  - wherein the actual difference comprises a difference between an estimate of the powerup state IQ estimates at a bin of the at least one frequency bin and an estimate of the steady state IQ estimates at the respective bin.

2. The IQ estimation module of claim 1,
- wherein the at least one frequency bin comprises a first frequency bin and a second frequency bin, and
- the actual difference comprises a first actual difference between an estimate of the powerup state IQ estimates and an estimate of the steady state IQ estimates at the first frequency bin, and a second actual difference between an estimate of the powerup state IQ estimates and an estimate of the steady state IQ estimates at the second frequency bin.

3. The IQ estimation module of claim 2, wherein the IQ estimate extender comprises,
- an actual difference generator configured to compute the first and second actual differences;

a virtual difference generator coupled to the actual difference generator;

an interpolator coupled to the virtual difference generator; and an adjusted IQ estimate generator coupled to the interpolator, wherein the actual difference generator is configured to generate the first actual difference by subtracting the powerup state IQ estimate at the first frequency bin from the steady state IQ estimate at the first frequency bin, and the second actual difference by subtracting the powerup state IQ estimate at the second frequency bin from the steady state IQ estimate at the second frequency bin, the virtual difference generator is configured to generate a virtual difference between the powerup state IQ estimates and the steady state IQ estimates at a frequency bin of the frequency band that is neither the first frequency bin nor the second frequency bin, based on the first and second actual differences;

an interpolator is configured to generate the interpolated difference by interpolating the first and second actual differences across the frequency band based on the first and second actual differences and the virtual difference; and an adjusted IQ estimate generator is configured to adjust the powerup state IQ estimates based on the interpolated difference across the frequency band.

4. The IQ estimation module of claim 3, wherein the virtual difference comprises a first virtual difference and a second virtual difference, and each real component of the first and second virtual differences is a symmetric reflection over zero frequency hertz of each real component of the first and second actual differences.

5. The IQ estimation module of claim 4, wherein the virtual difference further comprises a third virtual difference corresponding to a zero frequency bin, wherein a real component of the third virtual difference corresponds to a value of a linear line on a frequency spectrum connecting each real components of the first and second actual differences, or connecting a real component of the first actual difference and a symmetric reflection over the zero frequency hertz of a real component of the second actual difference.

6. The IQ estimation module of claim 3, wherein the virtual difference comprises a first and second virtual differences and each imaginary component of the first and second virtual differences corresponds to a value of a linear line on a frequency spectrum connecting each imaginary component of the first and second actual differences.

7. The IQ estimation module of claim 3, wherein real components of the interpolated difference across the frequency band correspond to values of a parabolic curve or a linear line connecting real components of the first actual difference, the second actual difference and the virtual difference.

8. The IQ estimation module of claim 3, wherein imaginary components of the interpolated difference across the frequency band correspond to values of a linear line connecting imaginary components of the first actual difference, the second actual difference and the virtual difference.

9. The IQ estimation module of claim 3, wherein the at least one frequency bin further comprises a third frequency bin, the actual difference further comprises a third actual difference between an estimate of the powerup state IQ estimates at the third frequency bin and an estimate of the steady state IQ estimates at the third frequency bin, and the first and second frequency bins are closer to zero frequency hertz than the third frequency bin.

10. The IQ estimation module of claim 1, wherein the at least one frequency bin comprises a first frequency bin, the actual difference comprises a difference between an estimate of the powerup state IQ estimate at the first frequency bin and an estimate of the steady state IQ estimates at the first frequency bin, the IQ estimate extender is configured to interpolate the actual difference by expanding the actual difference corresponding to the first frequency bin across the frequency band.

11. The IQ estimation module of claim 1, wherein the steady state IQ estimator is configured to generate at least two sets of the steady state IQ estimates, each set corresponding to a different temperature range, and wherein the IQ estimation module further comprises, a temperature detector configured to detect a temperature of the IQ estimation module, and a steady state IQ estimate selector coupled to the temperature detector the steady state IQ estimator, and the IQ estimate extender, and configured to select a set of steady state IQ estimates from the at least two sets of the steady state IQ estimates, from which the actual difference is computed by the IQ estimate extender, based on the temperature detected by the temperature detector.

12. An in-phase and quadrature-phase (IQ) estimation method comprising, generating powerup state IQ estimates across a frequency band based on a powerup calibration of an IQ signal receiver;

generating steady state IQ estimates for at least one frequency bin of the frequency band during a steady state operation of the IQ signal receiver;

computing an actual difference between an estimate of the powerup state IQ estimates at a bin of the at least one frequency bin and an estimate of the steady state IQ estimates at the respective bin;

interpolating the actual difference across the frequency band; and adjusting the powerup state IQ estimates across the frequency band based on the interpolated difference.

13. The IQ estimation method of claim 12, wherein the at least one frequency bin comprises a first frequency bin and a second frequency bin, and the actual difference comprises a first actual difference between an estimate of the powerup state IQ estimates and an estimate of the steady state IQ estimates at the first frequency bin, and a second actual difference between an estimate of the powerup state IQ estimates and an estimate of the steady state IQ estimates at the second frequency bin.

14. The IQ estimation method of claim 13, wherein the IQ estimation method further comprises, generating a virtual difference between the powerup state IQ estimates and the steady state IQ estimates at a frequency bin of the frequency bin that is neither the first frequency bin nor the second frequency bin, based on the first and second actual differences, and wherein the interpolated difference is based on the virtual difference in addition to the first and second actual differences.

15. The IQ estimation module of claim 14, wherein the virtual difference comprises a first virtual difference and a second virtual difference, each real component of the first and second virtual differences is a symmetric reflection over zero frequency hertz of each real component of the first and second actual differences, and each imaginary component of the first and second virtual differences corresponds to a value of a linear line on a frequency spectrum connecting each imaginary component of the first and second actual differences.

16. The IQ estimation method of claim 13, wherein the at least one frequency bin further comprises a third frequency bin, the actual difference further comprises a third actual difference between an estimate of the powerup state IQ estimates at the third frequency bin and an estimate of the steady state IQ estimates at the third frequency bin, and the first and second frequency bins are closer to zero frequency hertz than the third frequency bin.

17. The IQ estimation method of claim 12, wherein the at least one frequency bin comprises a first frequency bin, the actual difference comprises a difference between an estimate of the powerup state IQ estimate at the first frequency bin and an estimate of the steady state IQ estimates at the first frequency bin, and the interpolated difference is generated by expanding the actual difference corresponding to the first frequency bin across the frequency band.

18. The IQ estimation method of claim 12, wherein at least two sets of the steady state IQ estimates are generated, each set corresponding to a different temperature range, and the IQ estimation method further comprising, detecting a temperature of an IQ estimation module configured to perform the IQ estimation method, and selecting a set from the at least two sets of the steady state IQ estimates based on the temperature of the IQ estimation module, from which the actual difference is computed.

* * * * *